United States Patent [19]
Holm

[11] Patent Number: 5,513,209
[45] Date of Patent: Apr. 30, 1996

[54] RESAMPLING SYNCHRONIZER OF DIGITALLY SAMPLED SIGNALS

[76] Inventor: Gunnar Holm, 12001 Belcher Rd. #88, Largo, Fla. 34643

[21] Appl. No.: 23,946

[22] Filed: Feb. 26, 1993

[51] Int. Cl.$^6$ ........................................................ H04L 7/00
[52] U.S. Cl. .............................. 375/354; 327/14; 327/45; 341/61; 341/102
[58] Field of Search .............................. 375/106, 4, 94, 375/118; 370/100.1; 307/517, 523; 328/62, 151; 341/61, 102

[56] References Cited

U.S. PATENT DOCUMENTS

| | | | |
|---|---|---|---|
| 4,281,318 | 7/1981 | Candy et al. | 341/61 |
| 4,755,794 | 7/1988 | Candy | 341/61 |
| 5,126,737 | 6/1992 | Torii | 341/61 |
| 5,225,787 | 7/1993 | Therssen | 325/151 |

OTHER PUBLICATIONS

Chu, S., et al., "Multirate Filter Designs Using Comb Filters", *IEEE Transactions on Circuits and Systems,* vol. Cas.–31, No. 11, pp. 913–924, Nov. 1984.
Franks, L. E., "Carrier and Bit Synchronization in Data Communication—A Tutorial Review", *IEEE Transactions on Communications,* vol. Com–28, No. 8, Aug. 1980.
Gitlin, R., et al., "Center–Tap Tracking Algorithms for Timing Recovery", *AT&T Technical Journal,* vol. 66, Issue 6, Nov./Dec. 1987.

*Primary Examiner*—Stephen Chin
*Assistant Examiner*—Amanda Le
*Attorney, Agent, or Firm*—Townsend and Townsend Khourie and Crew; Philip H. Albert

[57] ABSTRACT

A digital resampling system is provided for converting a first digital signal to a second digital signal, where both signals represent the same analog signal but sampled at two different clock rates which are not phase-locked together. A filter is clocked by the first clock and outputs filtered samples at the first clock rate, optionally omitting samples which will not be used. A phase indicator determines the relative phase position of the first and second clocks and indicates an integer phase value and a fractional phase value which together indicate where a tick of the second clock falls among the ticks of the first clock. The integer phase value identifies a clock cycle of the first clock in which a tick of the second clock occurs, and the fractional phase value represents a fraction identifying a position of the tick of the second clock within the clock cycle of the first clock. A sample selector selects M filtered samples from those provided by the non-decimating filter based on the integer phase value. A weight generator generates M weights based on the fractional phase value, and a weight averager weights the M filtered samples by the M weights, and outputs a sum or an average of the weighted samples. The resampler is applicable to digital-to-digital resampling, as well as resampling in an analog-to-digital or digital-to-analog conversion system.

14 Claims, 12 Drawing Sheets

RESAMPLING SYNCHRONIZER OF DIGITALLY SAMPLED SIGNALS

RELATED DOCUMENTS

This application is related to a document filed under the Document Disclosure Program, identified as Document #274736.

BACKGROUND OF THE INVENTION

The present invention relates to the field of digital signal processing. More specifically, one embodiment of the invention provides a means for converting a sampled representation of a time-continuous signal sampled by a first clock into a sampled representation of the time-continuous signal sampled by a second clock, where the first and second clocks are not synchronous with each other.

FIG. 1 shows one application, a communication system 10, in which the first and second clocks are typically not synchronized. Communication system 10 comprises a transmitter 12, a receiver 16, and an analog channel 14 connecting transmitter 12 to receiver 16. Transmitter 12 comprises an encoder 18, and possibly other modules not shown. Receiver 16 comprises a sigma-delta modulated (SDM) analog-to-digital converter (ADC) 20, a resampler 22, and a clock recovery means 24. Encoder 18 has an input for digital samples, an output for an analog signal, and a clock input coupled to a low frequency clock L, for timing the output of analog signal segments representing input digital samples. The analog output of transmitter 12 is an input to channel 14, which conveys the analog signal to the input of SDM ADC 20. SDM ADC 20 has a clock input driven by a high frequency clock H which is used to trigger the digital sampling of the analog signal output by channel 14 at regular intervals. The output of SDM ADC 20 is coupled to resampler 22. The output of resampler 22 is the output of communication system 10, which is the digital sample stream which was input to transmitter 12, with some delay and possibly some distortion. The output of resampler 22 is also an input to clock recovery means 24, which outputs a recovered clock L' to a second clock input of resampler 22. In alternate embodiments of communication system 10, clock L' is not recovered from the digital sample output, but is provided to resampler 22 via an external clock channel 21 from transmitter 12, or is supplied to receiver 16 by some other external clock source.

Communication system 10 is used to transfer digital samples from one point to another, over analog channel 14. Digital data is converted to an analog signal in transmitter 12, sent over analog channel 14, digitized at receiver 16, and digitally manipulated to recover the digital data originally sent. Such digital-analog systems are used for modem communications, compact disk players, digital audio tape, mobile telephones, and the like.

Typically, the digital samples take on a value selected from a set of finite possible values, where the particular value is determined by digital data which is to be transferred. For example, in a specific embodiment of a modem communication system, digital data in the form of zeroes and ones (bits) is input to a transmitter at a rate of 9600 bits per second. The transmitter selects these bits four at a time, forming a "symbol", and generates a digital value ranging from 0 to 15. An encoder within the transmitter accepts these digital symbols and outputs a segment of an analog signal associated with the digital symbol for the duration of the clock cycle. As is well known in the art, to fully recover the digital symbol, the duration of the analog segment must be at least two clock cycles of clock L. In other words, encoder 18 will output a segment representing a symbol for at least the period of two clock cycles of clock L.

However, as far as the present system is concerned, the actual symbols are not important, since these can be determined from the samples of the analog signal, if the timing is correct. For example, if two samples are taken of each analog symbol segment representing a symbol, the particular symbol can usually be determined (noise may prevent perfect recovery). However, if receiver 16 does not know where the boundaries of the analog segments are, then it is possible that samples from adjoining symbols would be combined. Thus it is important to be sampling the analog channel signal synchronized with the incoming signals, usually at a rate comparable to the clock rate L (the low frequency clock). However, this is not always possible or convenient, such as where the analog signal is sampled at a much higher rate, as is the case with SDM ADC's.

In a typical digital receiver, the analog signal is first digitized, and then the signal is manipulated by a digital signal processor or digital filter circuits. One notable difference between an analog signal and a digital signal is that the analog signal is time-continuous and amplitude-continuous. Time-continuity means that the analog signal can be measured at any point in time, and it will have a value at that point in time, whereas amplitude-continuity means that the value at the measured point in time could have an infinite number of values within a finite range. By contrast, once digitized, the analog signal is represented by a digital signal, which is a series of digital samples. The digital samples can only take on a finite number of values, usually the value closest to the sampled analog signal, and the digital signal is not defined between digital samples in the series.

As the foregoing discussion points out, a receiver must accurately sample the analog signal, minimizing the error introduced by the fact that the digital signal is a finite approximation to the analog signal. To recover the data represented by the analog signal, it is not enough to recover the signal, since the boundaries of each analog signal segment must be found. In some systems, the analog segment (of the finite set of possibilities) can be determined from a single sampling of the analog signal, at a fixed point in the analog signal segment, usually the center. Of course, to know where the center of the segment is, the clock L which the encoder used to encode the digital samples into analog signal segments, must be recovered or provided to the receiver.

In some communication systems (as in the example of FIG. 1), clock L is sent over a separate clock channel 21 from transmitter 12 to receiver 16, and in others it is provided by an external clock source (as would be the case in a digital mixer with asynchronous clocks). However, since clock channel 21 uses communication capacity, in systems where communication capacity is at a premium, clock L is recovered from the analog signal itself. In a compact disk player, for example, channels are not at a premium, so clocking information can easily be provided on a clock channel. However, for telephone data transmissions, an additional clock channel would be costly. In the digital mixer example, of two asynchronously sampled signals to be mixed, one is resampled, using the other as the resampled clock. Many methods of sending analog data signals with recoverable clock information are known. Whether the clock is transferred separately or is recoverable from the analog signal, a problem remains in that the two clocks, the sampling clock H and the signal clock L are not synchronous.

One obvious way to keep clock H and clock L in sync is to have clock H generated using a clock multiplier driven by clock L, in other words, phase-locking clock H to clock L. Since clock H is a higher frequency than clock L, the jitter of clock L is amplified at the frequency of clock H, and thus is one reason why phase-locking the clocks would be unacceptable. Lowering the frequency of clock H is not a viable solution, since clock H needs to be high so that SDM ADC 20 can oversample the analog signal to the appropriate resolution.

FIG. 2 is a block diagram of a typical resampling receiver 25, as would be used in communication system 10 (FIG. 1). Receiver 25 comprises a SDM ADC 26, a resampler 28 coupled to the output of SDM ADC 26, and a clock recovery means 29 which adjusts the phase of the clock used to resample a signal. Clock recovery means 29 receives the digital data stream output by resampler 28 and provides a phase shift value or a recovered clock to an input of resampler 28. In alternate embodiments, the clock is generated by means other than recovery from the signal itself.

SDM ADC 26 comprises a noise shaper 30 for shaping the analog input to SDM ADC 26, an A/D 32 for converting the shaped analog input to one of N digital sample levels at each clock tick (a timing point such as a rising or falling edge) of an oversampling clock input to SDM ADC 26, and a low-pass filter (LPF) 34, which filters and decimates the digital sample stream. "Analog-to-digital converter" refers to the converter itself (such as A/D 32), whereas "sigma-delta modulated analog-to-digital converter", or just SDM ADC, refers to the converter and the associated filtering conventionally associated with sigma-delta converters (such as SDM ADC 26), to the extent that filtering is used. This difference is indicated in FIG. 2, by SDM ADC 26 and A/D 32.

Resampler 28 comprises an upsampler 36 coupled to an input of resampler 28, a LPF 38 coupled to the output of upsampler 36, and a sample selector 40 coupled to an output of LPF 38. In alternate embodiments, LPF 38 is replaced with an interpolator.

Receiver 25 transforms an analog, time-continuous signal into a stream of digital samples representing the value of the analog signal at clock ticks of a clock L', as follows.

The analog signal is applied to noise shaper 30, which outputs a noise-shaped analog signal to A/D 32, as is conventional for SDM ADC's. A/D 32 samples the input analog signal at a clock rate H which is much higher (oversampling) than the Nyquist rate for the input analog signal (twice the bandwidth). The output of A/D 32 is fed back to noise shaper 30 through a digital-to-analog converter (D/A) 41. Noise shaper 30 shapes the analog signal to reduce the quantization error noise caused by A/D 32 sampling the amplitude-continuous input analog signal at only N levels (typically N=2 or 3). The quantization noise is reduced by sampling the input signal at a high rate, moving the noise (using the noise shaper) to a higher frequency range than the signal bandwidth, and then low-pass filtering the signal to eliminate the high frequencies containing the noise.

LPF 34 filters away the high frequencies, and decimates the data sampling rate by a factor of D, to attain a sampling rate comparable to twice the signal bandwidth. The decimation to a clock rate of H/D is done to simplify processing of the digital samples, as their number is reduced by a factor of D, and also to eliminate redundancy of digital samples representing a band-limited signal. The decimation does not result in loss of information, since the analog signal is band-limited to frequencies below (½ * H/D). Using a sinc filter comprising N integrators, a decimator, and N differentiators reduces hardware needs by a factor of roughly D/2, however such a filter introduces a fixed decimation phase, which is an undesired side effect when resampling to a different, and possibly varying, sampling phase.

Since the digital samples at clock rate H/D output by SDM ADC 26 do not coincide with the ticks of clock L (since H, or H/D, and L are independent of each other), the signal must resynchronized to the original clock L. This is done in receiver 25 by resampling the signal with a new clock, L', which is phase-locked to the original clock L. Since the ticks of clock L and H/D are not necessarily coincident in time because of the interclock drift, the values of the analog signal at the ticks of clock L' are not available directly from the digital samples at clock rate H/D.

Resampler 28 provides these values at the clock L' ticks, by estimating the value of the time-continuous analog signal for the times of the clock L' ticks from the samples of the signal at the clock H/D ticks, which are available at the output of SDM ADC 26. FIG. 3, discussed below, illustrates the resampling process.

A typical low frequency clock L for a modem is 9600 or 19200 hertz, and a typical high frequency clock H is 2.5 megahertz (or 2,457,600 hertz, with D=128 or 256), or higher if the receiver can process data at a high rate. Clock H is typically derived by a stable crystal oscillator. Although clock L might originally also derive from a stable oscillator, the clock L oscillator is free to drift relative to clock H, since the oscillators are independent. Furthermore, changes in the analog channel delay introduce apparent drifts of clock L. Where the original clock L is recovered at receiver 25 from the analog signal, the recovered clock will cancel out any jitter caused by channel delay, but the jitter on clock L' will cause noise problems if clock H is tied to clock L'.

FIG. 3(a) is a graph of the time-continuous analog signal applied to SDM ADC 26. FIG. 3(b) is a graph of the output of SDM ADC 26, which comprises digital values sampled at discrete times at a rate of H/D. FIG. 3(e) is a graph of digital values representing samples of the analog signal at times coincident with ticks of clock L'. FIGS. 3(c)–(d) show on method of deriving the values at clock L' from the values at clock H/D.

FIG. 3(c) is a graph of the output of upsampler 36, where digital samples with zero values are interleaved between samples at clock rate H/D to increase the number of samples.

FIG. 3(d) is a graph of the output of LPF 38, overlaid with a graph of the original analog signal. Although the additional samples in FIG. 3(d) do not exactly sample the original analog signal, they are close because the analog signal is a band-limited signal limited to frequencies below (½ * H/D). The digital samples in FIG. 3(e) are computed by interpolation of a number (in this case, 3) of the upsampled and low-pass filtered samples.

As shown in FIG. 2, when a SDM ADC and a resampler are combined, the digital signal is downsampled, filtered, upsampled, and re-filtered, all resulting in a loss of accuracy and consuming unnecessary signal processing resources. The input analog signal is first digitized at one clock rate, H, downsampled to another, H/D, upsampled to yet another, U * (H/D), and then resampled to a clock rate L'. From the above it is seen that an improved means for resampling sampled signals at an arbitrary phase is needed.

SUMMARY OF THE INVENTION

An improved resynchronizing sampler is provided by virtue of the present invention.

In one embodiment of a digital resampling system according to the present invention, a first digital signal is converted to a second digital signal, where both signals represent the same analog signal sampled at two different clock rates which are not phase-locked together. The system includes a non-decimating filter, a phase indicator, a sample selector, a weight generator, a weighted averager, and an output clocker.

The non-decimating filter, clocked by the first clock, outputs filtered samples, one per clock cycle of the first clock, except that in some embodiments, the filter does not output filtered samples which the filter determines will not be used further down the signal path.

The phase indicator determines the relative phase position of the first and second clocks to determine the position of a tick (a rising or falling edge, or other identifiable point of a cycle) of the first clock with respect to a tick of the second clock, and outputs an integer phase signal representing an integer number identifying a clock cycle of the first clock in which a tick of the second clock occurs, and a fractional phase signal representing a fraction identifying a position of the tick of the second clock within the clock cycle of the first clock. The integer number might be a modulo count of the number of first clock ticks between a time origin point and the tick of the latest clock cycle of the second clock, where the modulo is a number close to the ratio of the first and second clock frequencies. In some embodiments, the integer phase output is an arbitrated clock.

The sample selector selects filtered samples from the filtered samples provided by the non-decimating filter based on the integer phase value. The sample selector selects M of the filtered samples per clock cycle of the second clock, the particular selections being those samples near the tick of the second clock. The weight generator generates M weights based on the fractional phase, and the weight averager weights the M filtered samples by the M weights, and outputs a sum or an average of the weighted samples. The output clocker synchronizes the output of these averaged samples, which are averaged once per cycle of the second clock, to the ticks of the second clock, if necessary.

In another embodiment of the present invention, the resampling system is used in a SDM ADC system, where the first clock is a high frequency sigma-delta sampling clock, and the second clock is a signal clock either recovered from the analog signal, provided by a clock channel, or an external clock source. In the SDM ADC system, the non-decimating filter is usually, but not necessarily, a low-pass filter.

In yet another embodiment of the present invention, the resampling system is used in a SDM digital-to-analog converter (DAC) system, where digital data clocked at a low frequency clock is selected into a group of M samples, also sampled at the low frequency clock. A phase detector detects the relative phase of the low frequency clock and a high frequency sampling clock. Since the clocks are independent, they will drift relative to each other, and the relative phase will not be constant. The phase detector outputs an integer phase signal or an arbitrated clock (which identifies the high frequency clock tick nearest or following a tick of the low frequency clock), and a fractional phase signal or value. The fractional phase clock indicates where the low frequency tick falls within the clock cycle of the identified clock H cycle.

The fractional phase value is applied to a weighting means, which weights the samples in the group of M samples, and an input placer places one of the M weighted samples on a high frequency output line each clock cycle of the high frequency clock. The high frequency signal is then output to a SDM DAC which is operating with the high frequency clock. Thus, the low frequency digital signal is resampled to the high frequency clock before being input to a digital-to-analog converter (D/A), and the resampling takes into account the relative drift of the high and low frequency clocks. In an alternate embodiment, the group of M samples are filtered by a finite impulse response (FIR) filter, the input placer averages the M filtered samples supplied to it, and applies that one averaged value to its output for each clock H (high frequency clock) tick in a clock L clock cycle.

If a low-pass or other filter is used after the input placer and before the SDM DAC, a filter which can accept input samples at each tick of the high frequency clock is used. However, another filter which accepts inputs at M freely selectable, consecutive high frequency clock ticks could also be used. The selectabililty ensures that each sample which is used later is input to the filter, but only those samples which are known in advance to be needed are input.

A further understanding of the nature and advantages of the inventions herein may be realized by reference to the remaining portions of the specification and the attached drawings.

DESCRIPTION OF THE PREFERRED EMBODIMENTS

Figure 4:
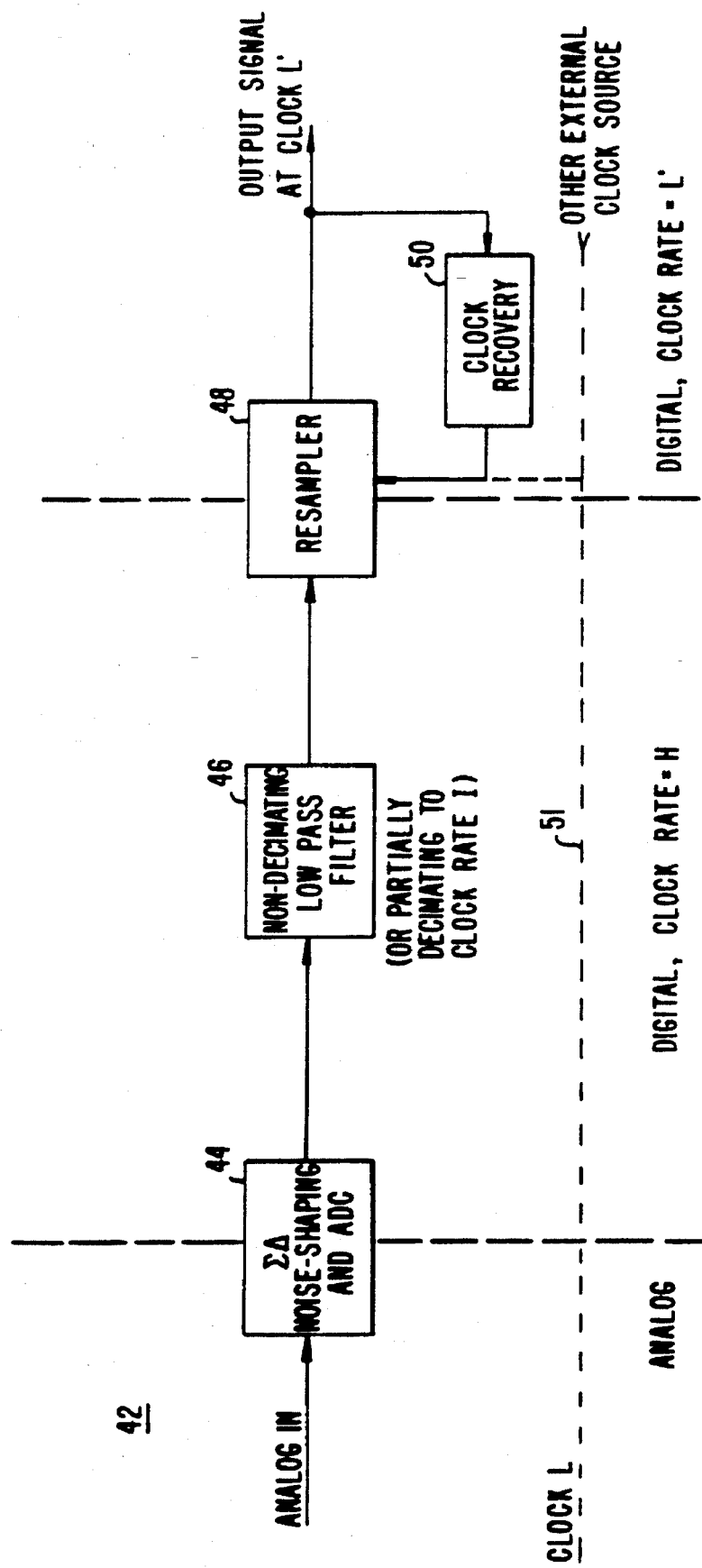
FIG. 4 is a block diagram of a embodiment of a sampling and resampling system according to the present invention, including a SDM ADC, a low-pass filter, and a resampler.

FIG. 4 is a block diagram of an sigma-delta modulating (SDM), resampling ADC system 42 which converts an analog signal comprising analog signal segments clocked at a clock rate L into a digital signal clocked at a clock rate L', where clock L' is phase locked to clock L, and the digital signal comprises digital samples representing samples of the analog signal segments.

ADC system 42 comprises a SDM ADC 44, a non-decimating low-pass filter (LPF) 46, a resampler 48, and a clock recovery means 50. In alternate embodiments, clock recovery means 50 is not used, and clock L' is provided by an external clock signal. The input to ADC system 42 is an analog signal, and where the external clock is used, a clock L' provided on clock channel 51, or otherwise, indicates the division of the analog signal into analog signal segments.

The output of SDM ADC 44 is a digital signal with a clock rate H, which is input to LPF 46. The output of LPF 46 is a digital signal with a clock rate H (in contrast to the typical decimating low-pass filter, which has a lower output rate), which is an input to resampler 48. The output of resampler 48 is the output of ADC system 42. If clock recovery means 50 is used, its input is the output of resampler 48, and the output of clock recovery means 50 is clock L', which is input to a resampling clock input of resampler 48. On the other hand, if clock channel 51 is used, it is input to the resampling clock input of resampler 48. In some embodiments, clock L' is not a physical signal, but is a series of numbers indicating the timing of the cycles of clock L'. As is well known in the art of clocks, a physical clock signal can be reconstructed from a series of cycle timing indicators, and a physical clock can be deconstructed into a series of cycle timing indicators. Clock H can also be deconstructed into numbers. For example, where the digital signal of interest is a signal sampled at clock rate H, clock H can be provided by a simple counter which counts the number of samples which have past a particular point in a signal processor.

In alternate embodiments, a design for ADC system 42 allows for a partially decimating LPF 46, in which case the output of LPF 46 is a digital signal with an intermediate clock rate I. This can be implemented as a decimating filter stage followed by a non-decimating filter.

Figure 5:
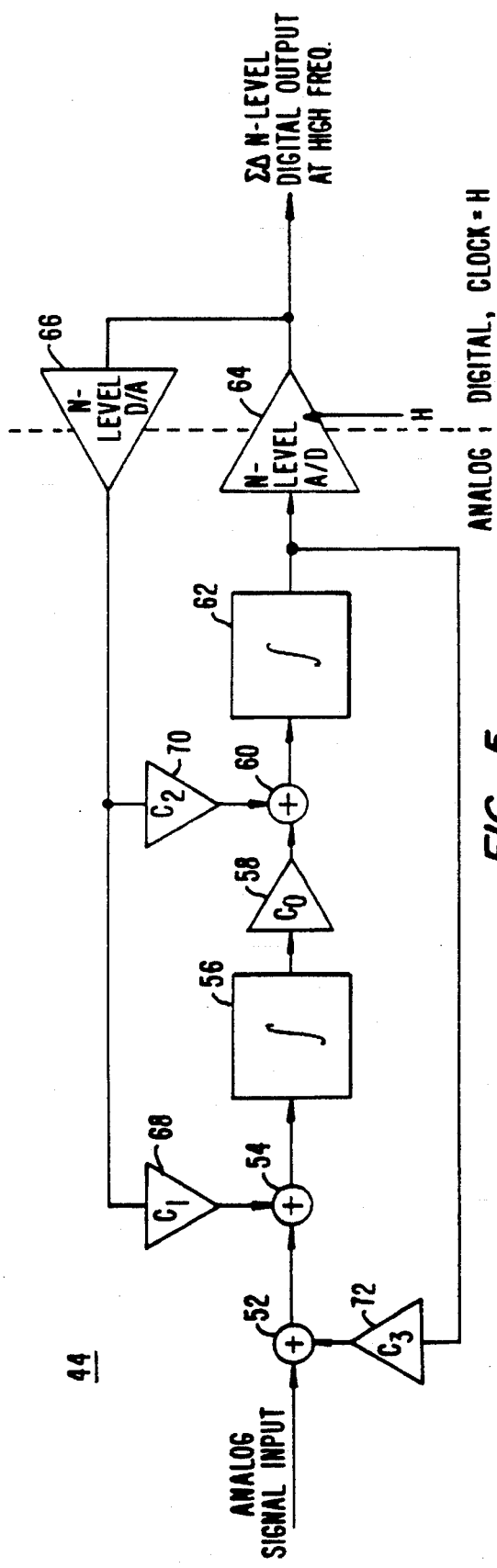
FIG. 5 is a block diagram of one embodiment of a SDM ADC used an the system of FIG. 4.

FIG. 5 is a block diagram of one possible example of SDM ADC 44, a second-order sigma-delta converter of one given type. A forward signal path of SDM ADC 44 comprises, in order, adders 52, 54, an integrator 56, an amplifier 58, an adder 60, an integrator 62, and N-level analog-to-digital sampler (A/D) 64. All components in the forward path input analog signals (time and amplitude continuous), and all, except A/D 64, output analog signals. The output of A/D 64 is a digital signal comprising digital samples each representing one of the N levels, output once per clock cycle of clock H.

The feedback path of SDM ADC 44 comprises digital-to-analog converter (D/A) 66, and amplifiers 68, 70, and 72. D/A 66 is coupled to the digital output of A/D 64, and converts its output back to analog. Amplifiers 68 and 70 receive their input from the output of D/A 66; the output of amplifier 68 is an input to adder 54 and the output of amplifier 70 is an input to adder 60. Amplifier 72 has an input coupled to the output of integrator 62, and the output of amplifier 72 in an input to adder 52. The amplification factors of amplifiers 58, 68, 70, 72 are $C_0$, $C_1$, $C_2$, $C_3$, respectively. Depending on the particular design, these numbers can be greater than one, equal to one (in which case, the amplifier can be eliminated), less than one, or even zero. In one application, of a modem, the values might be $C_0=\frac{1}{2}$, $C_1=\frac{1}{2}$, $C_2=\frac{1}{2}$, and $C_3=0$.

In operation, an analog signal input to SDM ADC 44 is output as digital N-level samples at a clock rate of H. The number of levels, N, is often chosen to be a power of two, and N=2 provides a 1-bit output. A 1-bit sampling eliminates the problem of having a multitude of voltage levels with which to compare the input signal, but 1-bit sampling causes considerable quantization noise. This quantization noise is moved (shaped) into higher frequency bands by the analog components of SDM ADC 44, as is well known in the art of sigma-delta converters.

Figure 6:
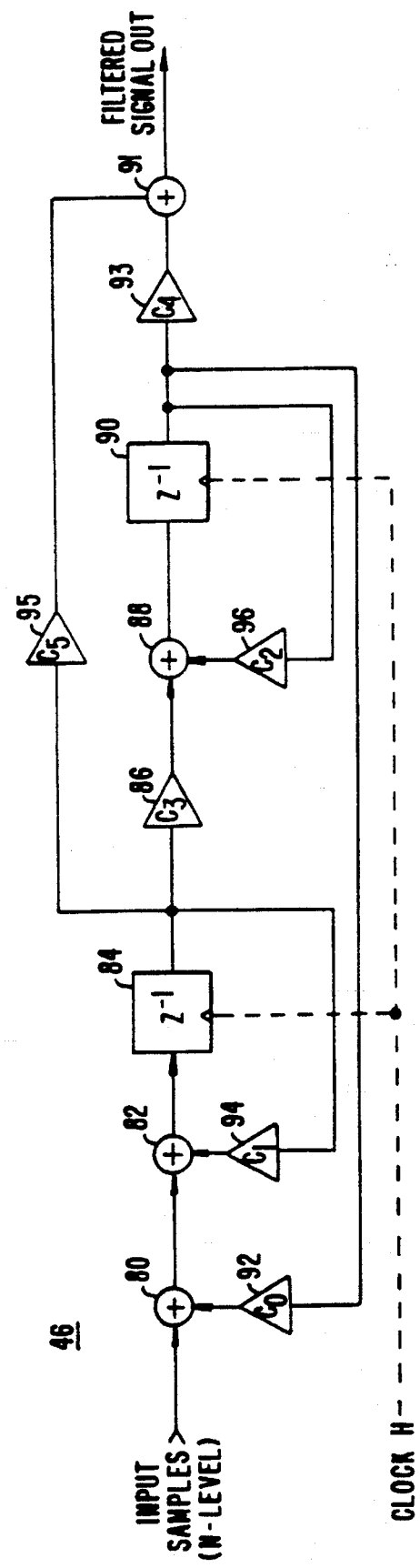
FIG. 6 is a block diagram of one embodiment of a low-pass filter used in the system of FIG. 4.

FIG. 6 is a block diagram of LPF 46, which filters out the high frequency components of the digital signal output by SDM ADC 44, which consists mostly of quantization noise. Significantly, the number of samples output by LPF 46 is the same as the number of samples input.

LPF 46 has a forward path comprising several signal manipulating elements which are, in order, adder 80, adder 82, unit delay 84, which outputs its input one clock cycle later, multiplier 86, adder 88, unit delay 90, multiplier 93, and adder 91. The adders are used to add either feedback signals (adders 80, 82, 88) or feedforward signals (adder 91) to the forward path signal. Several feedback paths are also present. A multiplier 92 applies the output of unit delay 90 to one input of adder 80 after multiplying the output by $C_0$; a multiplier 94 applies the output of unit delay 84 to one input of adder 82 after multiplying the output by $C_1$; a multiplier 96 applies the output of unit delay 90 to one input of adder 88 after multiplying the output by $C_2$. A feedforward path from the output of unit delay 84 is applied to an input of adder 91 after being multiplied by a multiplier 95, which multiplies the output by $C_5$. Multiplier 86 and multiplier 93, on the forward path, multiply the forward signal by $C_3$, and $C_4$, respectively. LPF 46 thus forms a second-order infinite impulse response (IIR) filter.

Depending on the particular design, $C_0$, $C_1$, $C_2$, $C_3$, $C_4$ and $C_5$ can each be greater than one, equal to one (in which case, the amplifier can be eliminated), less than one, or even zero. In the prior modem example, the values might be $C_0=-\frac{1}{128}$, $C_1=1$, $C_2=1-\frac{1}{128}$, $C_3=\frac{1}{64}$, $C_4=\frac{1}{128}$, and $C_5=0$.

Although FIG. 6 shows a second-order IIR, a preferred filter would have at least one more order than the noise shaper of the SDM ADC. This requirement has to do with the elimination of noise in the eventual output of the filter. If a second-order SDM noise shaper is used, the noise is shaped to rise in higher frequencies at a rate of 12 db/octave. If a second-order filter is used, the filter roll-off is 12 db/octave, so the noise would be flat up to the high frequencies, and therefore, at least a third-order filter, with 18 db/octave roll-off, should be used. Such a filter is easily constructed by placing two LPFs such as LPF 46 in the signal path in series. The second filter can be reduced to a first-order filter (giving a total of three orders) by setting $C_0=C_2=C_3=C_4=0$, eliminating unit delay 90 if that saves hardware or software, and setting $C_1=1-\frac{1}{128}$, and $C_5=\frac{1}{128}$. Although one set of values is given, other values might be preferred for other applications. Furthermore, the values which are expressed as powers of two as much as possible, might not be ideal where more resolution in the values is possible.

Figure 7:
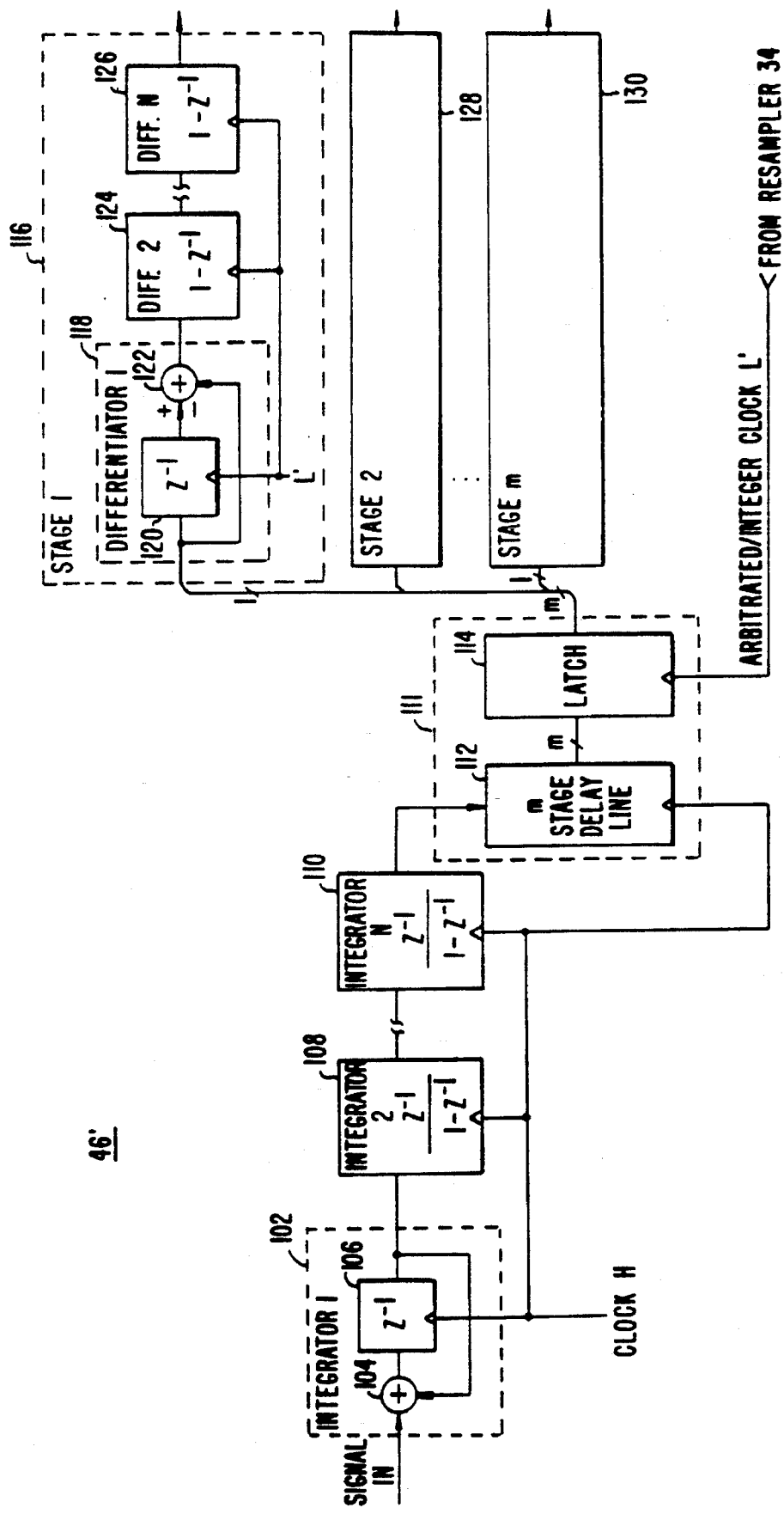
FIG. 7 is a block diagram of an alternate embodiment of a low-pass filter used in the system of FIG. 4.

FIG. 7 is a block diagram of an alternate embodiment of a low-pass filter 46', which is used in some embodiments of ADC system 42. LPF 46' comprises an integrator path, a selector system 111, and a differentiator array. The integrator path comprises N integrators, of which integrators 102, 108, and 110 are shown. Each integrator is similar, however only integrator 102 is shown in detail. Integrator 102 comprises an adder 104 (which is a modulo adder) and unit delay 106. An input of integrator 102 is coupled to an input of adder 104, the output of adder 104 is coupled to the input of unit delay 106.

The output of unit delay 106 is the output of integrator 102, and the output of unit delay 106 is also fed back to a second input of adder 104. In this way, integrator 102 provides the classical integrator impulse response, $z^{-1}/(1-z^{-1})$.

Unit delay 106 is clocked by clock H which, as FIG. 4 shows, is synchronous with the samples of the digital signal input to LPF 46'. Each of the other N-1 integrators also have unit delays clocked by clock H.

The output of integrator N 110 is provided to selector system 111. Selector system 111 inputs integrated samples from integrator 110 at clock rate H, and outputs a number M of consecutive samples from integrator 110. The particular set of consecutive samples are determined by the arbitrated clock provided by resampler 34 (described along with FIG. 8). LPF 46' also comprises M differentiator stages. Stage 1 116 receives a first input from selector system 111, and outputs a differentiated signal of the input. Also shown are stage 2 128 and stage M 130, coupled to separate outputs of selector system 111. The details of one stage, stage 1 116 are shown. A stage comprises N differentiators clocked by clock L'. A differentiator, such as differentiator 1 118 comprises a unit delay 120 clocked by clock L', and a subtractor 122 (which is a modulo subtractor), which outputs the difference between the output of unit delay 120 and the input of unit delay 120, the providing a filter with the impulse transfer function $(1-z^{-1})$.

Figure 1:
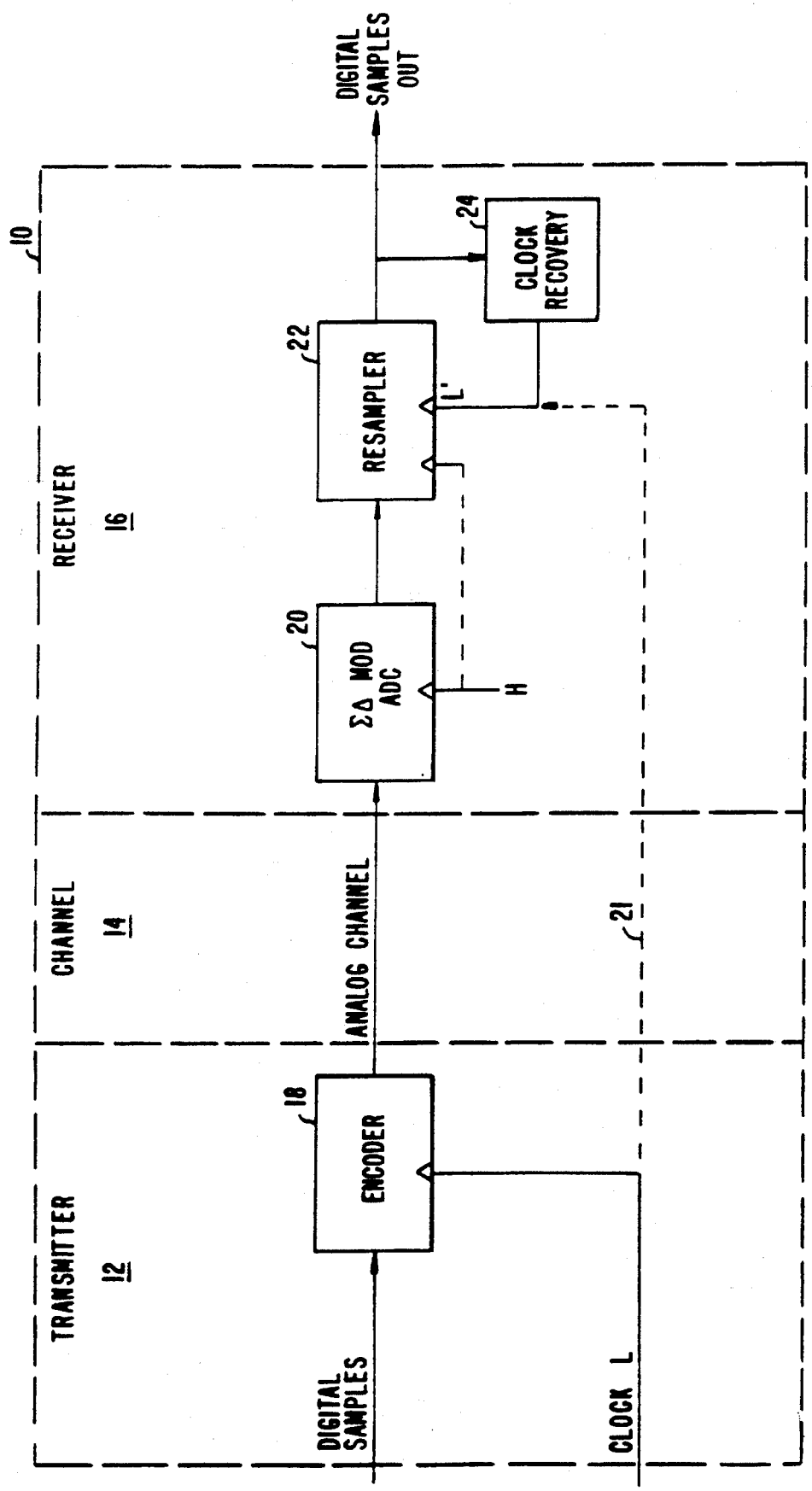
FIG. 1 is a block diagram of a communication system.
Figure 2:
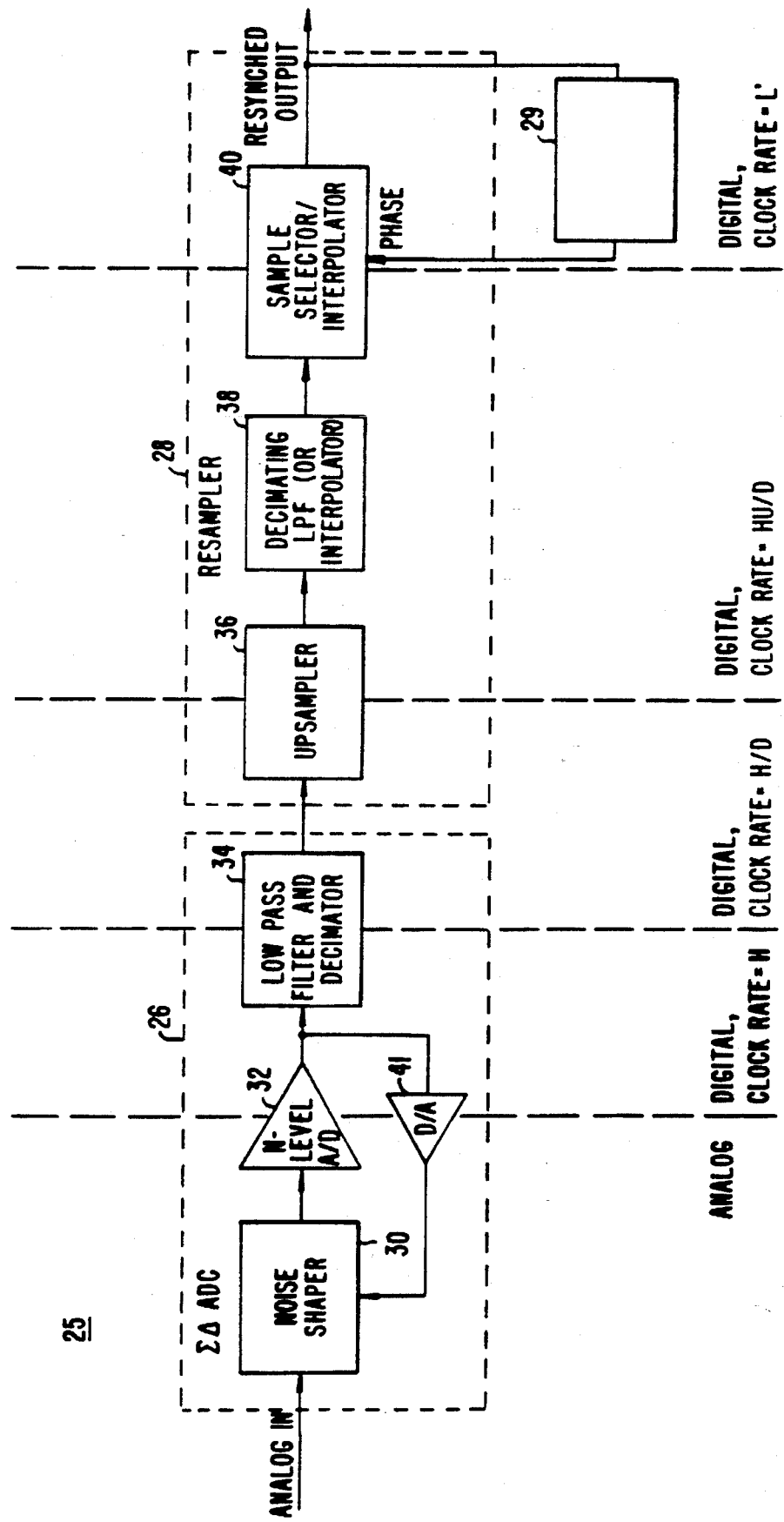
FIG. 2 is a block diagram of a known method of sampling an analog signal and resampling and synchronizing the sampled signal to a clock recovered from the analog signal.
Figure 3A:
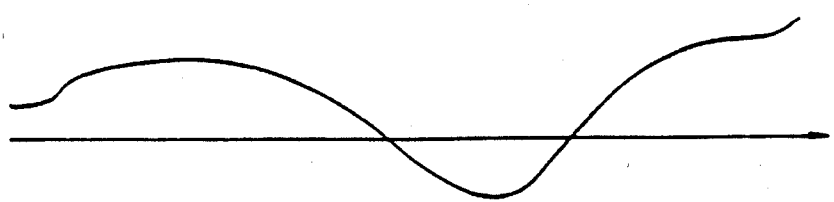
FIGS. 3(a)–(e) are graphs illustrating a resampling operation.
Figure 3B:
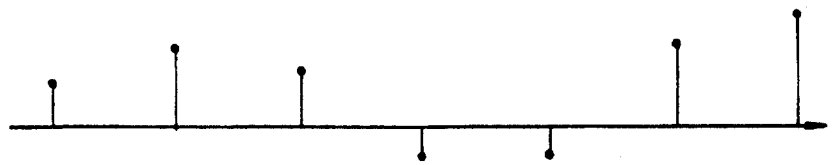
Figure 3C:
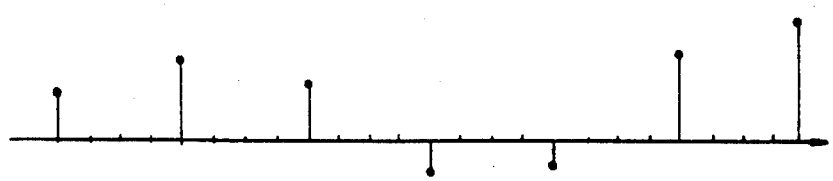
Figure 3D:
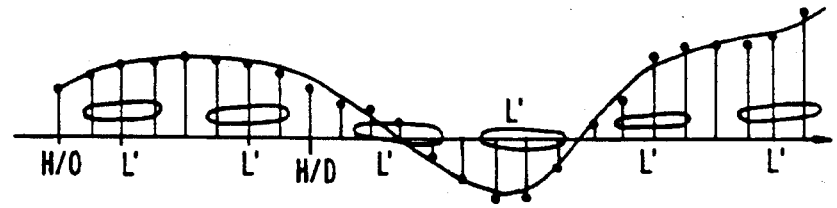
Figure 3E:
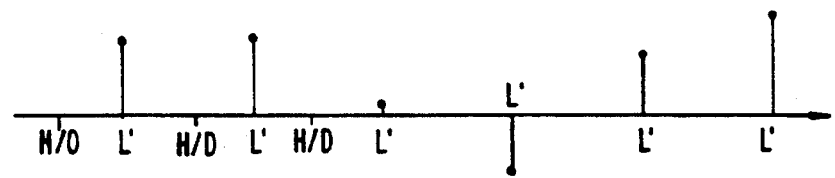

LPF 46' is an Nth order sinc filter, but one which effectively does not decimate its output. In a typical sinc filter, the output is decimated at a fixed phase, and the elements in the signal path beyond the filter must adjust to having this fixed sampling phase. In the system of FIG. 2, the adjustment is the addition of upsampler 36. Thus, a filter like LPF 46' with H/L differentiator stages can output as many values as are input, by setting M=H/L. However, in practice, M=2 or 3 is often sufficient, and by timing the selection of samples so that only samples that are going to be used are processed, much hardware or software can be saved.

There are a number of ways of implementing selector system 111, one of which is shown in FIG. 7. Therein, selector system 111 comprises an M-stage delay line 112 and a latch 114, with delay line 112 clocked at clock rate H, and latch 114 clocked at clock rate L. Because the M values sent to the differentiator stages are timed against the tick of clock L, which will likely vary with respect to the input clock H, only M differentiator stages are needed to cover all the phases used in the resampling process.

In some embodiments of LPF 46', selector system 111 comprises a counter and a demultiplexer, where the counter counts clock H ticks starting from each clock L tick, and the demultiplexer passes the first sample of M samples to the first of M output lines, then demultiplexes the next M-1 input samples onto the remaining M-1 output lines, and then ignores the next values until the next clock L tick. In other embodiments, the clocks of the first stages of each differentiator stage is timed to latch the correct input sample.

Although for illustration, N and M are at least three in FIG. 7, values lower than three are possible, depending on design requirements. For example, the higher H is, the lower M can be. Also, the innermost integrator and differentiator could be replaced by a hold circuit as is well known in the art of digital sinc filter design. Also, other means could be provided to lead the clock L ticks to center the clock tick with respect to the contents of the M-stage delay line, if necessary.

Depending on design requirements, either LPF 46 or LPF 46' could be used. LPF 46 is more efficient in terms of hardware used (or computing power used, if implemented in software), and provides all samples. On the other hand, LPF 46' does not introduce group delay into the digital signal, and does provide the M samples out of H/L which are actually used. LPF 46 can be made even more efficient with the proper selection of multiplier coefficients. If the coefficients (as an above example uses) are powers of two, the multipliers can be replaced with bit shifters.

Figure 8:
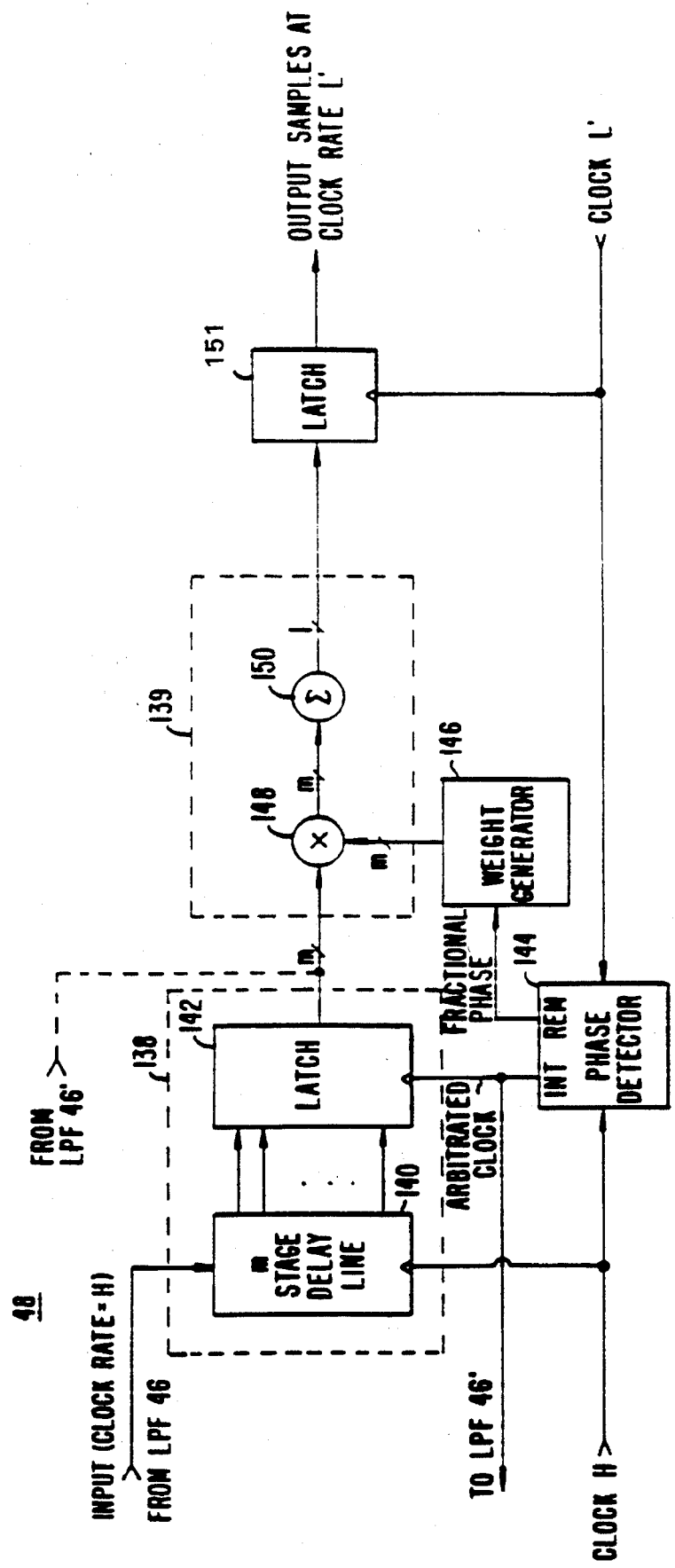
FIG. 8 is a block diagram of an embodiment of a resampler used in the system of FIG. 4.

FIG. 8 is a block diagram of resampler 48. Resampler 48 receives input from either LPF 46 (see FIGS. 4, 6) or LPF 46' (see FIGS. 4, 7), and outputs the desired signal, a digital representation of the analog signal originally input to ADC system 42, but one which is sampled at clock rate L'. In some embodiments where a clocking signal is provided, clock L' is the same as clock L.

Resampler 48 comprises a sample selector 138, a phase detector 144, a weight generator 146, a weighted averager 139, and an output latch 151. Sample selector 138 comprises an M-stage delay line 140 and a latch 142. Weighted averager 139 comprises a multiplier 148 and a summer 150.

Delay line 140 is clocked by clock H, receives an input sample from LPF 46 once per clock H cycle, and stores the last M samples received. The M outputs of delay line 140 are input to latch 142, which latches them at the clock tick of the arbitrated clock L'. The arbitrated clock ticks in coordination (such as following them by a suitable delay) with clock ticks of clock H, but only those following clock L' ticks. Thus, the arbitrated clock can prevent the M values from being latched while they are changing in the M-stage delay, but the arbitrated clock doesn't have all the information about the position of ticks of clock L', only which clock H tick was closest. In this sense, the arbitrated clock is an indication of the integer phase only.

The M output lines are input lines for multiplier 148. Phase detector 144 has a low clock input, which is the resampling clock input of resampler 48 on which clock L' is received and a high clock input on which clock H is received, although in some embodiments, clock L' is represented by values in memory indicating the position of each cycle of clock L' rather than an physical clock signal in which the timing of each cycle of clock L' is determined by the arrival time of a clock L' tick at the resampling clock input of resampler 48. Phase detector 144 has an integer phase output, which clocks latch 142 (if LPF 46 is used) or in output to LPF 46' (if LPF 46' is used; see FIG. 7). Phase detector 144 also has a fractional phase output, which is an input to weight generator 146. The integer phase output can be an arbitrated clock as discussed above.

Weight generator 146 has M outputs for M weighting values, which are inputs to multiplier 148. Multiplier 148 has M outputs, which are inputs to summer 150, which has one output. The one output of summer 150 is an input to output latch 151, which also has a clock input, clocked by clock L'. The output of output latch 151 is also the output of resampler 48 as well as the output of ADC system 42.

In alternate embodiments, where LPF 46' is used, the functionality of sample selector 138 is provided by sample selector 111 in LPF 46', and the output of LPF 46', which is M digital signal lines, are inputs to multiplier 148. If LPF 46' is used, the integer phase signal, which supplies the arbitrated clock to latch 142, is instead supplied to LPF 46'.

In effect, what resampler 48 does is select the M samples at clock rate H which are near a tick of clock L', weight the M samples based on their distance from the tick of clock L', take an average of the weighted samples, and output that averaged value as the value of the signal at the tick of clock L'. Whether an average or a sum of the M weighted samples is taken is not important, since M is a constant value, and resampler 48 is a digital system, so a division by M is a simply added function. However, logically, referring to the output of resampler 48 as averaged samples makes more sense.

Non-decimating filter LPF 46 and quasi-non-decimating filter LPF 46' provide M samples from the M ticks of clock H nearest to the tick of L', which are then used to interpolate the value of the original signal at the tick of L'. In some designs, the resampler cannot handle data at the rate of clock H, so a decimating filter is included in the signal path to lower the sample rate from H to H'. Of course, with the lower clock rate of H', the M samples will not be as close to the tick of clock L' and therefore won't give as good an approximation for the original signal. The decision to trade off accuracy for lower sample rates depends on the application, but in any case, the lower clock rate H' should preferably be high enough that upsampling is not required to capture M signal samples near the tick of clock L'. If greater accuracy is needed, M can be increased.

With the two inputs to phase detector 144, it determines a phase offset, which is a real number (integer and fraction) indicating the relative offset of ticks of clock H and clock L'. For example, if the rising edges of clocks H and L' are used as ticks, the phase offset would indicate where the rising edge of clock L' was relative to the rising edge of clock H. Of course, since the clocks are independent, this phase offset value will likely change for each rising edge of clock L'. The unit of measurement of the phase offset is the number of clock cycles of clock H, and in embodiments where the L' ticks are represented by numbers, the numbers are in time units synchronized to the time units used to measure clock H, in which case phase detection is the operation of subtracting two numbers. Logically, in other embodiments, the two outputs of phase detector 144 can be thought of as an integer clock, or arbitrated clock, as described above, and a fractional phase output signal.

Since a reference point is needed, when ADC system 42 begins operation, a rising edge of clock H will be designated the origin, and all measurements of phase will be to that point. Because the actual origin is not all that important to the operation of ADC system 42, any cycle can be used, and the origin can be moved every D clock cycles, thus giving a phase offset which is a modulo D real number. This shifting of the origin keeps the phase offset from growing monotonically. Furthermore, if D is chosen to be the nearest integer to the ratio H/L', then the phase offset value will only change by the small difference between H/L' and D. Thus, the phase offset describes the position of a rising edge (or other tick) of clock L' with respect to the rising edges (or other ticks) of clock H, modulo D.

Phase detector 144 separates the phase offset into an integer phase and the remaining fractional phase. These two values, which are updated at the L' clock rate, are output by phase detector 144 as the integer phase signal and the fractional phase signal. The integer phase signal, or value, is used for selecting M samples which are input to resampler 48 at the H clock rate. Because the integer phase value 48 identifies the clock cycle of clock H in which a tick of clock L' falls, the input sample (clocked by clock H) which is nearest in time to the tick of clock L' can be identified. In one particular embodiment, M=3. Where M=3, sample selector 138 selects the clock H sample closest to the clock L' tick, and one sample on either side of the first selected sample. In another embodiment, M=4, and sample selector 138 selects the two clock H samples most previous in time to the clock L' tick and the two clock H samples following the tick. Even if the M samples following the clock L' tick are used, the signal can then later be shifted by an appropriate amount if necessary.

For proper interpolation, the M samples should be weighted differently depending on their distance from the clock L' tick. For example, where M=4, the two samples closest to the clock L' tick will be weighted more heavily than the two samples further out on each side, and if the clock L' tick is closer to one of the two inner samples, that closer sample should be given more weight than the other samples. In one example, M=2 and one of the weights given to one of the two samples is proportional to the distance from the clock L' tick to the other sample, i.e., a classical linear interpolation of a value between two points. If M=3, a parabolic interpolation can be done.

Weighting generator 146 performs this process of generating weighting values for weighting the M selected samples. It generates M weights, one per each of the M selected samples, from the fractional phase value which indicates the relative position of the clock L' tick and the M samples. Because of sample selector 138, the possible positions of the clock L' tick within the M selected samples can only vary by one full cycle of clock H, because otherwise, different samples would have been selected (neglecting any constant phase shift of clock L'). For example, if M=4, the tick of clock L' will fall somewhere between the middle two samples. If M is odd, such as M=3, the particular samples used depend on how sample selector 138 is implemented. In one implementation, the center sample of the three selected samples is the sample occurring just before the clock L' tick, whereas in other implementations, the center sample is the sample which is the closest either before or after the tick.

Weighted averager 139 outputs a weighted average (or sum, as discussed above) of the M selected samples, each weighted by one of the M weights. Multiplier 148, if built in digital hardware, might be a parallel multiplier which accepts the M selected samples, pairs each of the M selected samples with an associated weight, and outputs the product of each of the pairs. If implemented in a digital signal processor, multiplier 148 might be an array multiply routine. In combination with summer 150, which sums the M outputs of multiplier 148, weighting averager 139 essentially produces a scalar dot product of two vectors, a vector of M selected sample values and a vector of weights.

Although weighting averager 139 calculates an output for each tick of clock L', an output latch 151 is used to ensure that the timing of the output is synchronized to clock L' itself. Of course, if the values output by resampler 48 do not need to be synchronous (such as where clock L' is an imaginary clock present only in software), then output latch 151 is not needed. Also, if the components of resampler 48 always use the same amount of time to do calculations, then output latch 151 is not needed.

Figure 9:
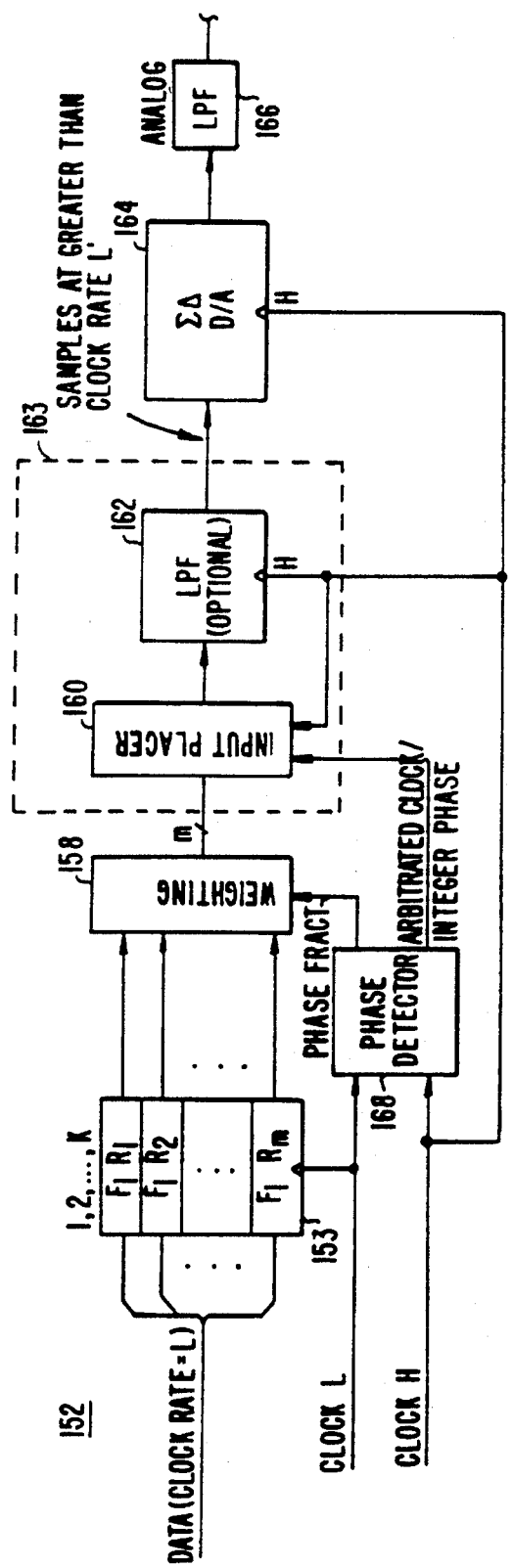
FIG. 9 is a block diagram of an SDM DAC system where data clocked at a low rate is output clocked at a higher, unrelated rate.

FIG. 9 is a block diagram of a sigma-delta modulated digital-to-analog (SDM DAC) system 152 where data clocked at a low rate (clock L) is output clocked at a higher, unrelated rate (clock H) to a SDM DAC. SDM DAC system 152 comprises a finite impulse response (FIR) filter 153, a sample weighting means 158, a sample rate converter 163, a SDM DAC 164, an analog filter 166, and a phase detector 168.

FIR filter 153 comprises an input for receiving data at a clock rate L, a clocking input, and M outputs for filtered samples. Sample weighting means 158 comprises M inputs for M filtered samples, an input for a weighting phase value, and M outputs for M weighted samples. Sample rate converter 163 comprises M inputs for M weighted samples, an input for a placement phase, a clocking input, and a clocked output. SDM DAC 164 comprises an input for a digital signal, a clock input timing the digital signal, and an analog signal output.

The data input of FIR filter 153 receives the data to be converted from digital to analog, and which represents samples of the signal at ticks of clock L. The output of FIR filter 153 is M filtered signals. The FIR filter shown in FIG. 9 comprises Kth order FIR filters, although some of the filters might be pass-through filters (i.e., transfer function= 1 with matched delay). Since M independent Kth order filters would use K delay stages each, and the K delay stages of each filter would contain the same data, these can be combined into one delay line and M sets of K values.

The M outputs of FIR filter 153 are the M filtered sample inputs to sample weighting means 158, and the M weighted outputs of sample weighting means 158 are the M weighted signal inputs to sample rate converter 163. In some embodiments, sample rate converter 163 comprises an input placer 160 coupled to receive the M weighted signal inputs and an output which is first filtered by a low-pass filter 162, before being output. In either case, the output of sample rate converter 163 is coupled to the digital signal input of SDM DAC 164. The clock input of SDM DAC 164 is clocked by clock H. The output of SDM DAC 164 is an input to analog low-pass filter 166, and the output of analog low-pass filter is the analog signal output of the digital-to-analog system.

The operation of SDM DAC system 152 will now be described. The following discussion assumes that the clock L is not tied to clock H. System 152 will still work if they are phase locked, but it would not be as useful. For example, if clock L and clock H are phase locked, FIR filter 153, sample weighting means 158 and sample rate converter 163 could be replaced with a simple counter to count the number of clock H cycles and output each input data value for a fixed number of clock H cycles. The following discussion also assumes that clock H is a higher frequency clock than clock L, as sigma-delta signal processing systems operate at a higher clock rates than the signal which is being processed.

When the input digital signal is received by filter 153, the signal is filtered into M filtered signals. In a simple embodiment, filter 153 acts only like a delay line, and the M filtered outputs comprise unfiltered samples delayed by up to M ticks of clock L. Where M=2, two input samples are passed to weighting means 158. In a more complex case, the M filtered values output by filter 153 are approximations of the analog signal at M adjacent ticks separated by the period of clock H. In the complex case, one of the M signals can be the input unfiltered except for a matching delay, and the other signals are filtered by an FIR using the K stages. A higher value of K results in a better approximation of the analog signal at adjacent clock ticks. In both cases, M signals are applied to weighting means 158 per clock L tick, however the cases are treated differently in input placer 160 (see below).

Phase detector 168 operates in a similar manner to phase detector 144, detecting the phase difference between ticks of clock L and clock H, and outputting an integer value (or an arbitrated clock) and a fractional value for each cycle of clock L, indicating the position of the clock L tick with respect to the clock H ticks. In some embodiments, the integer phase output indicates a count of the number of clock H cycles since the last clock L tick, whereas in other embodiments, a count of clock H cycles is kept modulo some number to keep the count in reasonable bounds, and the integer phase output indicates the clock L ticks as a function of the count of clock H cycles. As should be apparent from this discussion, both methods of indicating relative phase are equivalent.

The fractional phase signal (one fractional phase value per clock L cycle) is used by sample weighting means 158 to weight the M filtered signals (again, one sample per output line per cycle of clock L). Sample weighting means 158 operates in a similar manner to weight generator 146 and multiplier 148 (see FIG. 8). The weight values (M per clock L cycle) are then output to input placer 160.

In the simpler case mentioned above, input placer 160 outputs one of the M weighted values per clock cycle of clock H. The first weighted value is output after the phase integer signal indicates the first clock H cycle after a clock L tick, followed by the second weighted value, etc., up to the Mth weighted value. Input placer 160 then outputs zero values until the phase integer signal again indicates the first clock H cycle after a clock L tick. In other embodiments, input placer 160 outputs the Mth value on each clock cycle of clock H after the first M clock cycles of clock H, until the next tick of clock L. Of course, deciding what to output in between each of the M outputs, either a value or zero, is only necessary when more than M clock cycles of clock H occur in a clock cycle of clock L.

In the more complex case discussed above, input placer 160 averages its M weighted input signals, and places this one result on its output for the duration of a clock L cycle. In applications requiring a constant output value for the duration of a clock L cycle, this more complex case is preferred.

Figure 10:
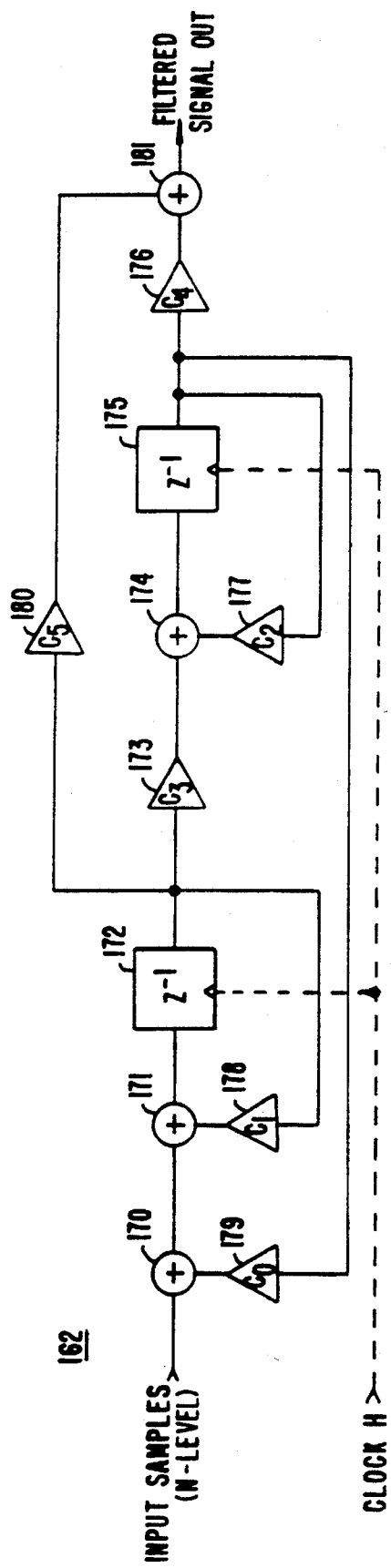
FIG. 10 is a block diagram of a non-decimating low-pass filter as used in the SDM DAC system shown in FIG. 9.

FIG. 10 is a block diagram of LPF 162, which operates in a manner similar to LPF 46, shown in FIG. 6, except possibly with different coefficients. In the same way as LPF 46, additional stages might be added to increase the order of LPF 162. However implemented, LPF 162 accepts each of the input samples from input placer 160. If input placer 160 and LPF 162 are combined, LPF 162 could be implemented similar to LPF 46', with M stages.

Figure 11:
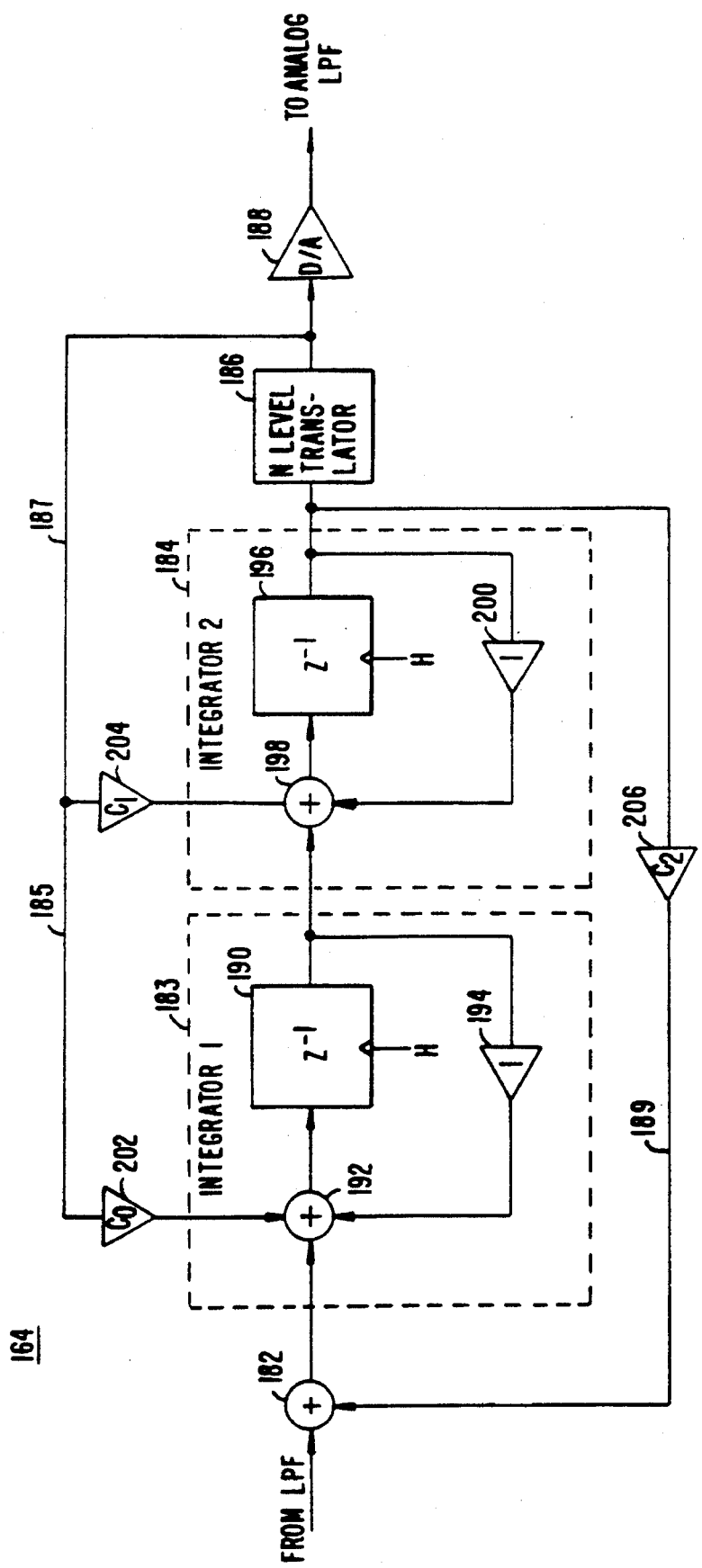
FIG. 11 is a block diagram of an SDM DAC as used in the SDM DAC system shown in FIG. 9.

FIG. 11 is a block diagram of SDM DAC 164, which is a second-order sigma-delta digital-to-analog converter and comprises an adder 182, two integrators 183, 184, three feedback paths 185, 187, 189, an N-level translator 186, and an N-level D/A 188. Integrator 183 comprises an adder 192, a unit delay 190, and a unit multiplier 194. Integrator 184 comprises an adder 198, a unit delay 196, and a unit multiplier 200.

A forward signal path passes an input signal at a clock rate H, in order, to adder 82, integrator 183, integrator 184, N-level translator 186, and D/A 188. Within integrator 183, the input of integrator 183 is applied to adder 192, which outputs the signal to unit delay 190, which outputs the signal to integrator 184. Within integrator 183, a feedback path is provided from unit delay 190 through unit multiplier 194 to another input of adder 192. In some embodiments, unit multiplier 194 is eliminated or replaced with a non-unity coefficient multiplier. Within integrator 184, the input of integrator 184 is applied to adder 198, which outputs the signal to unit delay 196, which outputs the signal to translator 186. Within integrator 184, a feedback path is provided from unit delay 196 through unit multiplier 200 to another input of adder 198. In some embodiments, unit multiplier 200 is eliminated or replaced with a non-unity coefficient multiplier.

Feedback path 185 feeds the signal at the output of translator 186 back to adder 192 through a multiplier 202;

feedback path 187 feeds the signal at the output of translator 186 back to adder 198 through a multiplier 204; and feedback path 189 feeds the signal at the output of integrator 184 back to adder 182 through a multiplier 206.

In operation, a digital signal at clock rate H is input to SDM DAC 164, is filtered by the digital elements, and a filtered signal at clock rate H is applied to N-level translator 186. Latch 186 outputs one digital value from N possible values, and an analog signal level represented by that digital value is output by D/A 188. For example, If translator 186 were a two-level translator, it could output the most significant bit of the digital value output by integrator 184, and D/A 188 would output either a high or low voltage. In a three level translator, D/A 188 might output one of a positive voltage, zero volts, or a negative voltage.

Figure 12:
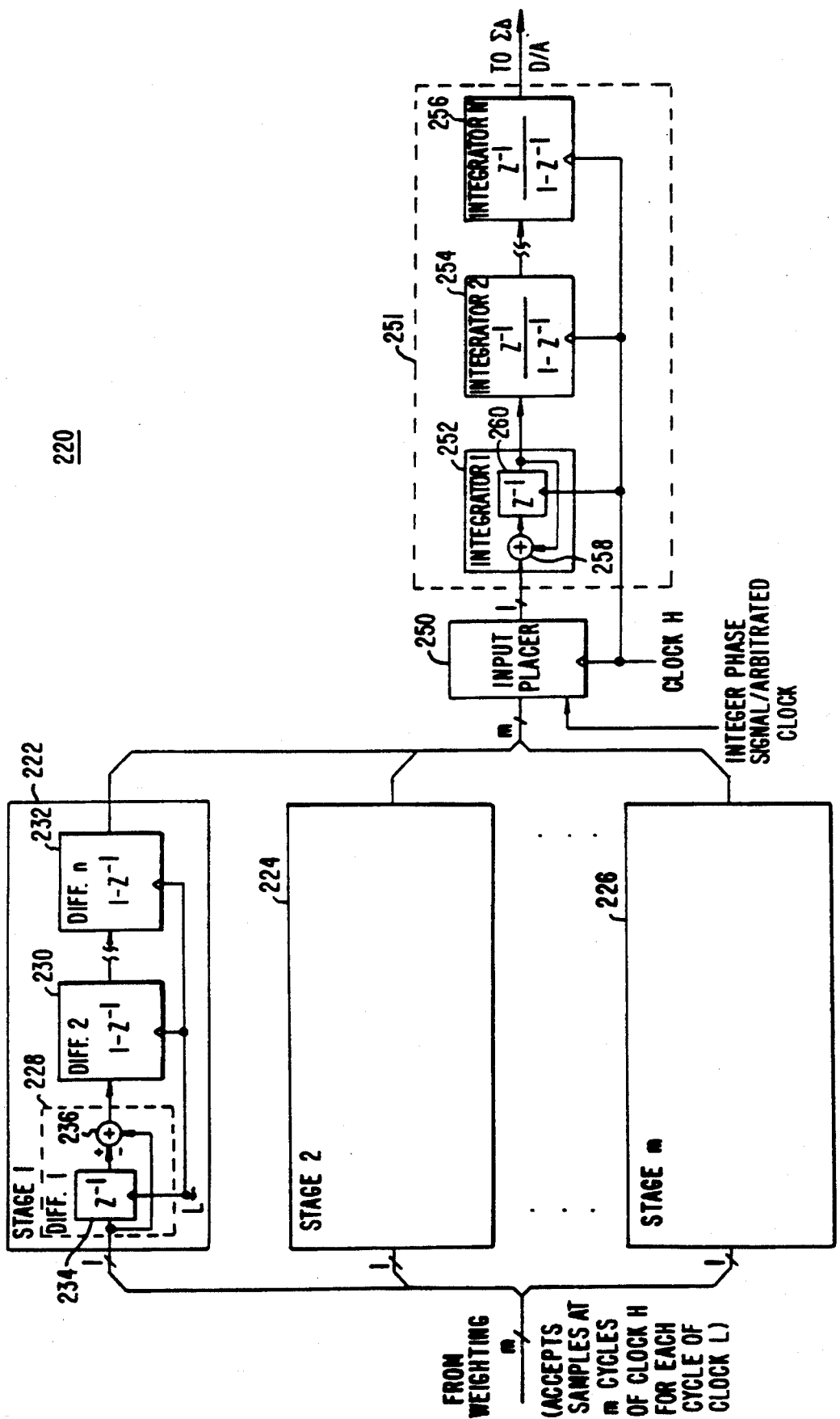
FIG. 12 is a block diagram of an alternate embodiment of a low-pass filter used in the SDM DAC system shown in FIG. 9.

FIG. 12 is a block diagram of an alternate embodiment of a sample rate converter 220, which could be used in place of sample rate converter 163 in SDM DAC system 152, shown in FIG. 9. Sample rate converter 220 accepts M input values per clock L cycle, and outputs one output value per clock cycle of clock H. Sample rate converter 220 comprises M differentiator stages 222, 224, ..., 226, an input placer 250, and an integrator stage 251. Each differentiator stage is similarly configured, however only stage 1 222 is shown in detail. A differentiator stage comprises N differentiators 228, 230, ..., 232, clocked by clock L. Each differentiator comprises a unit delay and an adder. For example, differentiator 1 228 comprises unit delay 234 and adder 236.

The differentiator stages collectively output M signals clocked by clock L (one value per signal per clock L cycle). These M signals are applied to input placer 250 which outputs one of the M values (or zero, in some cases) each clock cycle of clock H, as does input placer 160 (see FIG. 9). The output signal clocked by clock H is then applied to integrator stage 251. The particular one of the M values or zero to be output is determined by the integer phase signal input to input placer 250, as discussed in connection with input placer 160.

Integrator stage 251 comprises N integrators, similarly configured. One such integrator, integrator 1 252, is shown in detail. Integrator 1 252 comprises adder 258 and unit delay 260 coupled as a conventional integrator.

Figure 13:
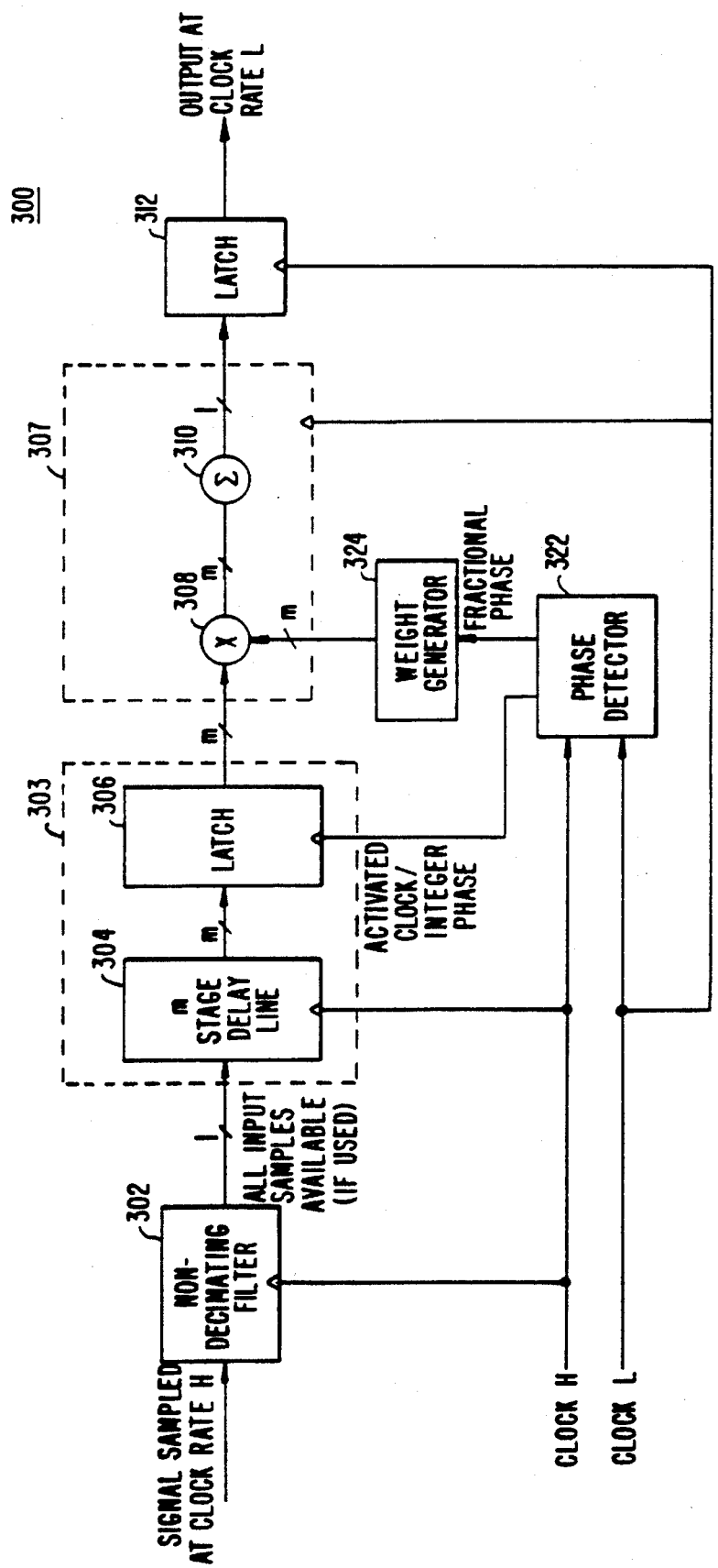
FIG. 13 is a block diagram of a digital-to-digital resampling system according to the present invention.

FIG. 13 is a block diagram of a digital-to-digital resampling system 300 wherein a signal sampled at a high frequency is resampled at a lower frequency where the two frequencies are independent of each other. Resampling system 300 comprises a non-decimating filter 302 (such as LPF 46 or LPF 46'), a sample selector 303, a weighting averager 307, a latch 312, a phase detector 322, and a weight generator 324.

The input signal at clock rate H is applied to filter 302, which outputs a filtered signal at clock rate H. Filter 302 and sample selector 303 are clocked by clock H, and latch 312 is clocked by clock L. The output of non-decimating filter 302 is an input to sample selector 303. The M outputs of sample selector 303 are inputs to weighting averager 307.

Sample selector 303 comprises an M-stage delay line 304 and a latch 306. Weighted averager 307 comprises a multiplier 308 and a summer 310. Delay line 304 is clocked by clock H, receives an input sample from filter 302 once per clock H cycle, and has M outputs. The M outputs of delay line 304 are input to latch 306, which has M output lines and is clocked by the arbitrated clock. The M output lines of latch 306 are input lines for multiplier 308. Phase detector 322 has a low clock input coupled to clock L and a high clock input on which clock H is received, although in some embodiments, clock H is a virtual clock tied to the input of values to filter 302.

Phase detector 322 has an integer phase output (arbitrated clock), which is an input to latch 306, and a fractional phase output, which is an input to weight generator 324. Weight generator 324 has M outputs for M weighting values, which are inputs to multiplier 308. Multiplier 308 has M outputs, which are inputs to summer 310, which has one output. The one output of summer 310 is an input to output latch 312, which also has a clock input, clocked by clock L. The output of output latch 312 is also the output of resampling system 300.

As with sample selector 138 (see FIG. 8), the functionality of sample selector 303, in some embodiments, is not provided by an M-element delay line and a latch, but by a module which outputs M samples selected consecutively from input samples at clock rate H, where the choice of the M samples is determined by an integer phase value (arbitrated clock) supplied to sample selector 303 by phase detector 322.

As with resampler 48, resampling system 300 selects M samples of the signal input at the clock rate H which are near a tick of clock L, weight the M samples based on their distance from the tick of clock L, take an average of the weighted samples, and output that averaged value as the value of the signal at the clock L tick, and does so without needing an upsampler.

Figure 14:
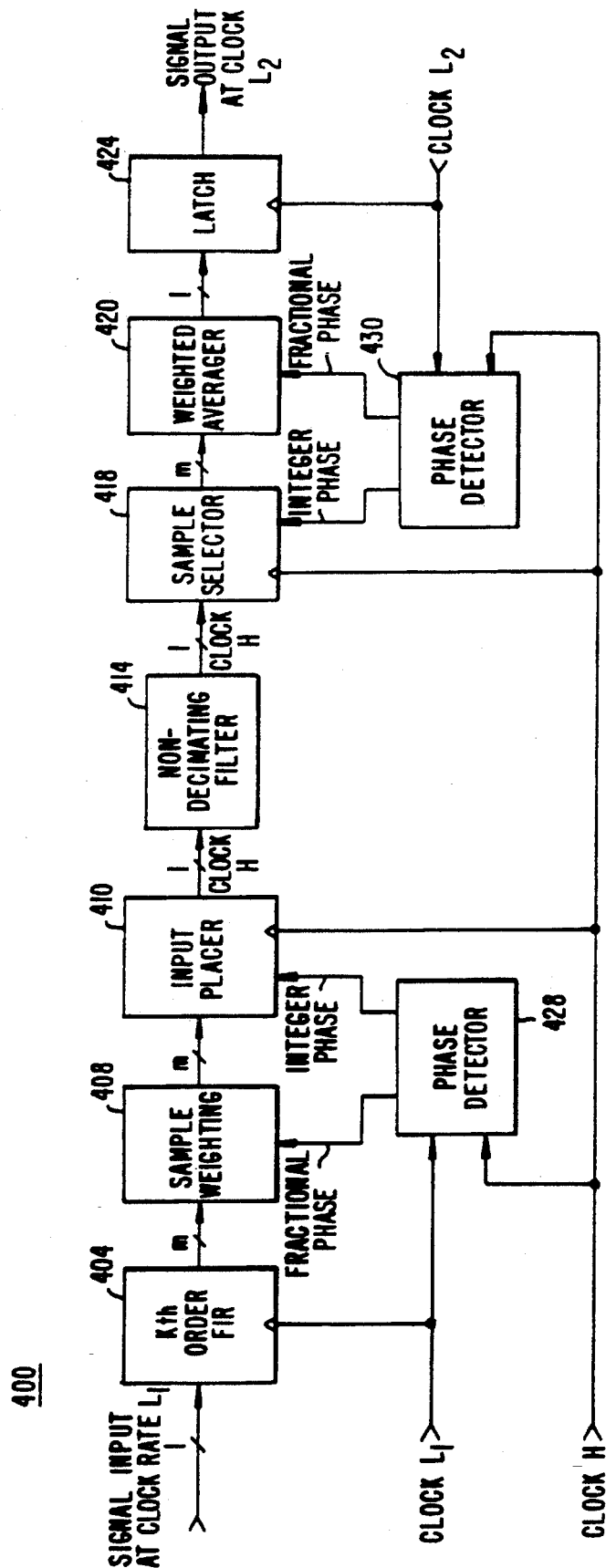
FIG. 14 is a block diagram of a digital-to-digital resampling system using an intermediate high-frequency clock.

FIG. 14 is a block diagram of a digital-to-digital resampling system 400 using an intermediate high-frequency clock. Resampling system 400 comprises a Kth order FIR filter 404, a sample weighting means 408, input placer 410, non-decimating filter 414 (such as LPF 46 or LPF 46'), sample selector 418, weighting averager 420, latch 424, and phase detectors 428, 430. Resampling system accepts an input signal at the input to filter 404 at a clock rate $L_1$ and outputs a resampled signal representing the same signal as the input signal, but sampled at clock $L_2$, using clock H, where clock H is of a higher frequency than clocks $L_1$ and $L_2$, and where the three clocks are independent.

Such a system is useful for mixing digital signals sampled with independent clocks.

Filter 404 outputs M signals (M samples per clock $L_1$ cycle) to sample weighting means 408. Sample weighting means 408 inputs a fractional phase signal (one value per clock $L_1$ cycle) from phase detector 428, and outputs M weighted signals (M samples per clock $L_1$ cycle) to input placer 410. Input placer 410 receives an integer phase signal from phase detector 428, and clock H, and outputs one sample per clock cycle of clock H to non-decimating filter 414. Non-decimating filter 414 outputs one filtered value per clock cycle of clock H, to sample selector 418.

Sample selector is clocked by clock H, receives an integer phase signal (arbitrated clock) from phase detector 430, and outputs M selected samples per clock cycle of clock $L_2$. Sample selector 418 can time the output of the M samples be receiving clock $L_2$ directly, or by using the integer phase signal and the clock H to determine the ticks of clock $L_2$.

The M outputs of sample selector 418 are the M signal inputs to weighted averager 420, which also receives a fractional phase signal from phase detector 430. The output signal of weighted averager 420 is one signal with samples at ticks of clock $L_2$. This output is input to latch 424, which, if used, ensures that the signal samples are output synchronously with the ticks of clock $L_2$.

The resampling of a signal clock $L_1$ to a signal at clock $L_2$ will now be described. The clock $L_1$ signal is input to filter 404, which is similar to filter 153 (see FIG. 9), outputs M signals at the $L_1$ clock rate. Phase detector 428 determines where a tick of clock $L_1$ falls in time with respect to the ticks of clock H, and outputs two signals. The integer phase signal (arbitrated clock) indicates the clock H ticks between which the clock $L_1$ tick falls, while the fractional phase signal indicates where between those clock H ticks the clock $L_1$ tick falls.

The fractional phase signal is supplied to sample weighting means 408, which weights each of the M signals with respect to their positions relative to a clock H tick. The weighted values are then passed to input placer 410.

Input placer 410, referring to the supplied integer phase signal, outputs one of the M input signal samples per clock H cycle. The operation of input placer 410 is similar to that of input placer 160 (see FIG. 9). Input placer 410 outputs the one sample per clock H to non-decimating filter 414, which filters the values and outputs a filtered signal, one sample per clock H cycle. Of course, internally non-decimating filter 414 could by decimating by sampling first at an even higher frequency.

The output of non-decimating filter 414 is input to sample selector 418, which outputs M of the clock rate H samples each clock cycle of clock $L_2$. The particular M samples selected are determined by the integer phase (arbitrated clock) signal, as with sample selector 303 (see FIG. 13). The M samples are then weighted and averaged by weighted averager 420 into one sample per clock cycle of clock $L_2$. The weights given to each of the M samples input to weighted averager 420 are determined by the fractional phase signal, as with weight generator 324 and weighted averager 307 (see FIG. 13). Phase detector 430 indicates the integer and fractional portion of the phase difference between clock $L_2$ and clock H. Finally, latch 424, if used, ensures that the clock rate $L_2$ output of weighted averager 420 is synchronous with clock $L_2$.

The above description is illustrative and not restrictive. Many variations of the invention will become apparent to those of skill in the art upon review of this disclosure. Merely by way of example, the invention could be practiced with digital hardware or in software modules performing similar functions in a digital signal processor. The scope of the invention should, therefore, be determined not with reference to the above description, but instead should be determined with reference to the appended claims along with their full scope of equivalents.

What is claimed is:

1. A digital resampling system for converting a first digital signal representing an analog signal into a second digital signal representing the analog signal, where the first digital signal comprises a series of digital samples each representing a level of the analog signal at ticks of a first clock, where the second digital comprises a series of digital samples each representing a level of the analog signal at ticks of a second clock, and where the first clock is independent of the second clock, the digital resampling system comprising:

a non-decimating filter, clocked by the first clock and coupled to receive the first digital signal, for outputting a filtered sample for each clock cycle of the first clock;

a phase indicating means, coupled to said first clock and said second clock for indicating a relative phase position for each clock cycle of the first clock, said relative phase position indicating a position of a tick of said first clock with respect to a tick of said second clock, said phase indicating means comprising an integer phase output for outputting an integer phase signal and a fractional phase output for outputting a fractional phase signal, said integer phase signal representing an integer number identifying a clock cycle of the first clock in which a tick of the second clock occurs, and said fractional phase signal representing a fraction identifying a position of said tick of the second clock within said clock cycle of the first clock;

a sample selector, coupled to receive said filtered samples from said non-decimating filter and coupled to receive said integer phase signal from said phase indicating means, said sample selector for selecting a number, M, of said filtered samples, wherein a given sample is selected when said integer phase signal indicates an integer phase value within a fixed range of M integer values;

a weight generation means, coupled to receive said fractional phase signal from said phase indicating means, for outputting M weighting factors which are functions of said fractional phase signal;

a weighted averaging means, coupled to receive said M weighting factors from said weight generation means and said M filtered samples from said sample selector, for weighting each of said M filtered samples by a corresponding weighting factor of said M weighting factors and outputting a sum of the weighted samples; and an output clocking means, clocked by the second clock and coupled to said output of said weighted averaging means, for outputting a weighted sum once per clock cycle of the second clock, said output of said output clocking means being the second digital signal.

2. The apparatus of claim 1, wherein said non-decimating filter is an N-th order infinite impulse response filter, N being an integer greater than two.

3. The apparatus of claim 1, wherein said non-decimating filter is an N-th order sinc filter with M differentiator stages, N being an integer greater than two.

4. An analog-to-digital conversion system for converting an analog signal into a digital signal, wherein the digital signal is a series of digital samples representing a sample of the analog signal at a points in time indicated by ticks of a signal clock, comprising:

a noise shaper for outputting a noise-shaped signal, said noise shaper shaping an error component of the analog signal, wherein said noise shaper is configured to accept the analog signal and a feedback signal used for determining said error component;

an analog-to-digital sampler clocked by a sampling clock, coupled to an output of said noise shaper, for outputting an intermediate digital signal comprising digital samples of said noise-shaped signal sampled at timing edges of said sampling clock, wherein said sampling clock is independent of the signal clock and said sampling clock is a higher frequency clock than said signal clock;

a digital-to-analog converter, coupled to said analog-to-digital sampler output, for providing said feedback signal to said noise shaper;

a low-pass filter, coupled to the output of said analog-to-digital sampler, for filtering out unwanted frequency components of said intermediate digital signal, wherein said low-pass filter outputs at least M samples per cycle of said signal clock, where M is an integer greater than one;

a phase indicating means, coupled to said signal clock and to said sampling clock, for indicating a relative phase position of cycles of said timing edges of sampling clock and said signal clock, wherein said phase indicating means outputs an integer phase signal indicating which sampling clock timing edges a signal clock timing edge falls between in time, and outputs a fractional phase signal indicating a timing of said signal clock timing edge between said sampling clock timing edges;

a sample selector, coupled to said low-pass filter and coupled to receive the integer phase signal of said phase indicating means, for selecting M samples from said output of said low-pass filter per cycle of the signal clock, said selection of M samples determined by said integer phase signal;

a weight generation means, coupled to receive said fractional phase signal from said phase indicating means, for outputting M weighting factors which are functions of said fractional phase signal;

a weighted averaging means, coupled to receive said M weighting factors from said weight generation means and said M samples from said sample selector, for weighting each of said M samples by a corresponding weighting factor of said M weighting factors and outputting a sum of the weighted samples; and an output clocking means, clocked by said signal clock and coupled to said output of said weighted averaging means, for outputting a weighted sum once per clock cycle of the signal clock, said output of said output clocking means being the digital signal.

5. The apparatus of claim 4, wherein said noise shaper, said analog-to-digital sampler and said digital-to-analog converter form a sigma-delta modulated analog-to-digital converter of at least one sigma-delta modulated stage and wherein said low-pass filter is a filter of an order at least as large as an order of said sigma-delta modulated analog-to-digital converter.

6. The apparatus of claim 4, wherein said noise shaper, said analog-to-digital sampler and said digital-to-analog converter form a sigma-delta modulated analog-to-digital converter of at least one sigma-delta modulated stage and wherein said low-pass filter is a filter of an order of one greater than an order of said sigma-delta analog-to-digital converter.

7. The apparatus of claim 4, wherein said low-pass filter is a non-decimating infinite-impulse-response filter or a sinc filter.

8. The apparatus of claim 4, wherein said low-pass filter is a quasi-non-decimating sinc filter.

9. A digital-to-analog conversion system for converting a digital signal into an analog signal, wherein the digital signal is a plurality of digital samples each representing a signal level and received by the conversion system on successive ticks of a signal clock, comprising:

a digital delay line, for storing a number, K, of most recently received digital samples at an input of the conversion system, said delay line clocked by the signal clock;

a digital filter array of a number, M, of Kth-order digital filters, coupled to receive said K most recently received digital samples, for outputting M filtered signals comprising one digital sample each per clock cycle of the signal clock;

a phase indicating means, coupled to receive the signal clock and coupled to receive a sampling clock, said sampling clock provided to the conversion system by a clock source independent of the signal clock, for indicating a relative phase position of cycles of the ticks of said sampling clock and said signal clock, wherein said phase indicating means outputs an integer phase signal indicating which sampling clock ticks a signal clock tick falls between in time, and outputs a fractional phase signal indicating a timing of said signal clock tick between said sampling clock ticks;

a weight generation means, coupled to receive said fractional phase signal from said phase indicating means, for outputting M weighting factors which are functions of said fractional phase signal;

a weighting means, coupled to receive said M weighting factors from said weight generation means and M samples from said digital filter array per signal clock cycle, for weighting each of said M samples by a corresponding weighting factor of said M weighting factors and outputting M weighted samples;

a sample selector, coupled to said weighting means and coupled to receive said integer phase signal from said phase indicating means, for outputting one of said M weighted samples each cycle of said sampling clock, said selection of said M samples determined by said integer phase signal; and a sigma-delta digital-to-analog converter, clocked by said sampling clock, for outputting an analog signal which corresponds to a digital signal represented by said digital samples output by said sample selector.

10. The apparatus of claim 7, further comprising a low-pass filter, coupled between said sample selector and said sigma-delta digital-to-analog converter, wherein an output of said low-pass filter depends on each input sample received at said sampling clock rate.

11. The apparatus of claim 7, further comprising a low-pass filter, coupled between said sample selector and said sigma-delta digital-to-analog converter, wherein an output of said low-pass filter depends on M consecutive input samples.

12. The apparatus of claim 7, further comprising a low-pass filter, coupled between said sample selector and said sigma-delta digital-to-analog converter, wherein an output of said low-pass filter depends on each input sample received at a filter sampling clock rate which is different from said sampling clock rate.

13. The apparatus of claim 7, further comprising a low-pass filter, coupled between said sample selector and said sigma-delta digital-to-analog converter, wherein an output of said low-pass filter depends on M consecutive input samples received at a filter sampling clock rate which is different from said sampling clock rate.

14. An analog-to-digital conversion system for converting an analog signal into a digital signal, wherein the digital signal is a series of digital samples representing a sample of the analog signal at a points in time indicated by ticks of a signal clock, comprising:

a noise shaper for outputting a noise-shaped signal, said noise shaper shaping an error component of the analog signal, wherein said noise shaper is configured to accept the analog signal and a feedback signal used for determining said error component;

an analog-to-digital sampler clocked by a sampling clock, coupled to an output of said noise shaper, for outputting an intermediate digital signal comprising digital samples of said noise-shaped signal sampled at timing edges of said sampling clock, wherein said sampling clock is independent of the signal clock and said sampling clock is a higher frequency clock than said signal clock;

a digital-to-analog converter, coupled to said analog-to-digital sampler output, for providing said feedback signal to said noise shaper;

a low-pass filter, coupled to the output of said analog-to-digital sampler, for filtering out unwanted frequency components of said intermediate digital signal, including unwanted frequency components introduced by said noise shaper, wherein said low-pass filter outputs, each cycle of said signal clock, more than one sample from a plurality of samples available in said each cycle of said signal clock;

means, clocked by said signal clock and coupled to receive said more than one sample, for outputting a weighted sum of said more than one sample once per clock cycle of the signal clock, said output of said means for outputting being the digital signal.

* * * * *